(12) United States Patent
Mathew et al.

(10) Patent No.: US 7,697,283 B2
(45) Date of Patent: Apr. 13, 2010

(54) ENCLOSURE FOOT ASSEMBLY AND MANUFACTURE

(75) Inventors: Dinesh Mathew, Fremont, CA (US); Brett William Degner, Menlo Park, CA (US); Thomas W. Wilson, Jr., Saratoga, CA (US); John Brock, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/241,016

(22) Filed: Sep. 29, 2008

(65) Prior Publication Data
US 2009/0175001 A1   Jul. 9, 2009

Related U.S. Application Data

(60) Provisional application No. 61/010,140, filed on Jan. 4, 2008, provisional application No. 61/010,884, filed on Jan. 11, 2008.

(51) Int. Cl.
*G06F 1/16* (2006.01)

(52) U.S. Cl. ............... 361/679.59; 248/188; 248/615

(58) Field of Classification Search ............ 361/679.59, 361/679.55; 248/188, 615; 312/351.1
See application file for complete search history.

(56) References Cited

U.S. PATENT DOCUMENTS

| | | | | |
|---|---|---|---|---|
| 4,742,478 A * | 5/1988 | Nigro et al. | ............ | 361/679.55 |
| 4,767,105 A * | 8/1988 | Caspers | ............... | 248/615 |
| 5,347,424 A * | 9/1994 | Akahane | ............... | 361/679.12 |
| 5,818,688 A * | 10/1998 | Gluskoter et al. | ....... | 361/679.09 |
| 6,053,589 A * | 4/2000 | Lin | ........... | 361/679.59 |
| 6,097,592 A * | 8/2000 | Seo et al. | ............... | 361/679.55 |
| 6,097,595 A * | 8/2000 | Cipolla | ............... | 361/679.21 |
| 6,282,084 B1 * | 8/2001 | Goerdt et al. | .......... | 361/679.55 |
| 6,498,719 B1 * | 12/2002 | Bridges | ............... | 361/679.34 |
| 6,654,237 B1 * | 11/2003 | Lee | ........... | 361/679.55 |
| 6,842,337 B2 * | 1/2005 | Helot et al. | ........... | 361/679.59 |
| 6,979,778 B2 * | 12/2005 | Xiong et al. | ............... | 248/615 |
| 7,095,610 B1 | 8/2006 | Banko | | |
| 7,293,749 B2 | 11/2007 | Banko | | |
| 7,328,880 B2 * | 2/2008 | Helot et al. | ........... | 361/679.27 |
| 7,450,373 B2 * | 11/2008 | Lee et al. | ............... | 361/679.55 |
| 2008/0253081 A1 * | 10/2008 | Tracy et al. | ............... | 361/683 |

* cited by examiner

*Primary Examiner*—Lisa Lea-Edmonds
(74) *Attorney, Agent, or Firm*—Kramer Levin Naftalis & Frankel LLP

(57) ABSTRACT

Wall portions, such as wall portions of electronic device housing components, are provided with one or more foot assemblies. A foot assembly can be formed by creating an internal cavity in an internal surface of the wall portion, an external cavity in an external surface of the wall portion, and a hollow passageway extending through the wall portion and between the cavities. The foot assembly can be completed by inserting a foot at least partially through the external cavity and hollow passageway and into the internal cavity, such that an external portion of the foot is at least partially contained within and contacting the surfaces of the external cavity, and such that an internal portion of the foot is at least partially contained within the internal cavity. A portion of the foot may be deformable to at least partially conform to the surfaces defining the internal cavity.

20 Claims, 8 Drawing Sheets

ENCLOSURE FOOT ASSEMBLY AND MANUFACTURE

CROSS-REFERENCE TO RELATED APPLICATIONS

This claims the benefit of U.S. Provisional Patent Application No. 61/010,140, filed Jan. 4, 2008, and U.S. Provisional Patent Application No. 61/010,884, filed Jan. 11, 2008, each of which is hereby incorporated by reference herein in its entirety.

FIELD OF THE INVENTION

This can relate to apparatus and methods for the construction of foot assemblies, and, more particularly, to apparatus and methods for the construction of foot assemblies of electronic device housing components.

BACKGROUND OF THE DISCLOSURE

Some known electronic devices (e.g., computers and televisions) include at least one internal electronic component associated with the operation of the device and a protective enclosure or housing that at least partially encloses the internal electronic component. Typically, the housing includes one or more housing components that serve to surround the internal electronic components at a peripheral region of the electronic device so as to cover and protect the internal components from adverse external conditions. Moreover, some known electronic devices include one or more foot assemblies that at least partially extend from an external surface of the protective housing to raise the electronic device off of a supporting surface (e.g., a table or the ground).

Cosmetic and geometric features are important to consumers of electronic devices, as these features help create the overall impression that one has of the electronic device. Therefore, the housing and one or more foot assemblies may also be configured to form and aesthetically enhance the outward appearance and size of the electronic device. For example, the shape, contours, and/or materials of the housing and foot assemblies may be designed so as to create a positive impression about the electronic device, thereby contributing to the overall success of the device in the market place.

However, most known electronic devices include foot assemblies that comprise a significant number of parts. The use of many foot assembly parts traditionally creates visible intersection locations, thereby making the outward appearance of the foot assembly non-uniform. Moreover, most known electronic devices include foot assemblies that require a housing with an increased overall thickness at the portions coupled to the foot assemblies. Increased housing thickness traditionally creates larger and more cumbersome electronic devices.

Accordingly, what is needed are apparatus and methods for the construction of foot assemblies that are small, easy to manufacture, and aesthetically pleasing.

SUMMARY OF THE DISCLOSURE

Apparatus and methods for the construction of foot assemblies are provided.

According to one embodiment of the invention, there is provided a method of forming a foot assembly. The method may include providing a wall having an internal wall surface and an external wall surface, forming a hollow passageway through the wall between the internal wall surface and the external wall surface, forming an external cavity in the external wall surface, forming an internal cavity in the internal wall surface, providing a foot having a middle foot portion extending between an internal foot portion and an external foot portion, inserting the internal foot portion through the external cavity, through the hollow passageway, and into the internal cavity, and conforming at least a portion of the internal foot portion to the internal cavity.

According to another embodiment of the invention, there is provided a foot assembly that may include a wall having an internal cavity in an internal wall surface, an external cavity in an external wall surface, and a hollow passageway extending through the wall between the internal cavity and the external cavity. The foot assembly may also include a foot having a middle foot portion extending between an internal foot portion positioned at least partially within the internal cavity and an external foot portion positioned at least partially within the external cavity. The at least a portion of the internal foot portion may be configured to conform to the internal cavity.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION OF THE DISCLOSURE

Apparatus and methods for the construction of foot assemblies are provided and described with reference to FIGS. 1-5.

Figure 1:
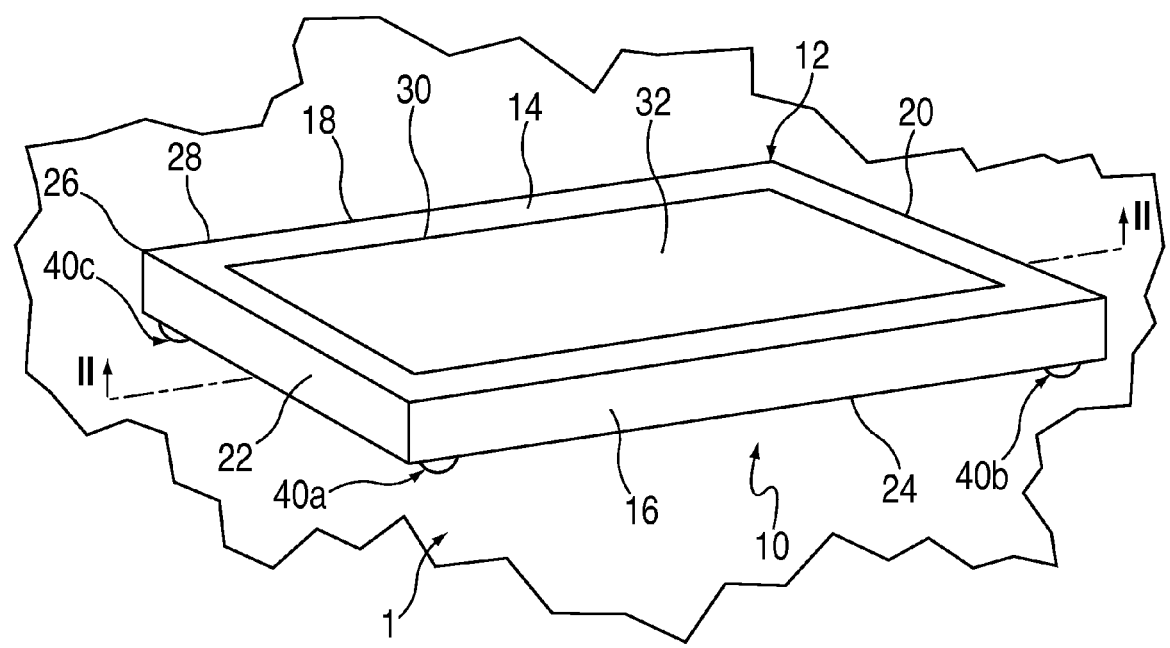
FIG. 1 is a top, front, left perspective view of an electronic device having foot assemblies, in accordance with some embodiment of the invention.

FIG. 1 is a perspective diagram of a simplified electronic device 10 including a foot assembly constructed in accordance with some embodiments of the invention. The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof. In some cases, the electronic device may perform a single function (e.g., a device dedicated to playing music)

and, in other cases, the electronic device may perform multiple functions (e.g., a device that plays music, displays video, stores pictures, and receives and transmits telephone calls).

Moreover, in some cases, the electronic device may be any portable, mobile, hand-held, or miniature electronic device having a foot assembly constructed in accordance with the invention so as to allow a user to use the device wherever the user travels. A miniature electronic device may have a form factor that is smaller than that of a hand-held electronic device, such as an iPod™ available by Apple Inc. of Cupertino, Calif. Alternatively, an electronic device that incorporates a foot assembly constructed in accordance with the invention may not be portable at all, but may instead be generally stationary, such as a desktop computer or television.

Electronic device 10 may include an enclosure or housing 12. Housing 12 may be configured to at least partially enclose one or more various electronic components associated with operating electronic device 10. The housing may typically define a cavity within which various electronic components can be placed. In general, housing 12, which can include several walls, may serve to at least partially surround the internal components so as to cover and protect the components from adverse conditions. By way of example, the components may include, but are not limited to, a motherboard, processors, circuit boards, controllers, bridges, memory, expansion slots, fans, power supplies, batteries, displays, hard drives, disk drives, modems, antennas, connectors, speakers, microphones, cameras, switches, buttons, and the like. Housing 12 can also support various components such as input/output ("I/O") mechanisms at its surfaces or within openings through the surfaces of its walls.

Housing 12 may also help to define the shape or form of electronic device 10. That is, the contour of housing 12 may embody the outward physical appearance of electronic device 10. In some embodiments, the housing may be formed in a flat panel configuration (e.g., its length and width are large as compared to its thickness). In some embodiments, the wall interfaces at the edges of the housing may include sharp corners. For example, the top peripheral edge may not include chamfers or corners with a radius but may rather include surfaces that intersect at right angles or substantially 90 degrees.

As shown in FIG. 1, for example, housing 12 of device 10 can be hexahedral. Although, it should be noted that housing 12 of device 10 is only exemplary and need not be substantially hexahedral, and that, in certain embodiments, the housing of device 10 could generally be formed in any other suitable shape, including, but not limited to, substantially spherical, ellipsoidal, conoidal, octahedral, or a combination thereof, for example.

As shown, housing 12 may include a top wall 14, various side walls, such as front wall 16, back wall 18, right wall 20, and left wall 22, and a bottom wall 24 opposite top wall 14. Housing 12 may be formed from one or more housing components. For example, housing 12 may be formed from at least two housing components, such as a top housing component and a bottom housing component, that may be attached together to form the entire housing. In some embodiments, housing 12 may include at least one housing component 26 that may include at least top, front, back, right, and left walls 14-22.

In some embodiments, housing 12 may include portions configured as a substantially thick band 28 that encircles at least a portion of an I/O region 30 of electronic device 10. For example, in some cases the walls may wrap at least two sides of electronic device 10 (e.g., right and left), while in other cases the walls may completely encircle I/O region 30 (e.g., front, back, left, and right). I/O region 30 represents an area that may at least partially expose one or more input and/or output components 32 of device 10. Examples of such components include displays, touch screen displays, buttons, keys, wheels, touch pads, and the like. In one particular implementation, I/O region 30 may at least partially expose a touch screen display region component 32 that may, for example, be a region where both text and graphical information are displayed to the user and through which the user may input information via touch.

Housing components of housing 12 can be formed from a wide variety of materials including, but not limited to, metals (e.g., steel, copper, titanium, aluminum, various metal alloys, etc.), ceramics, plastics, and the like. Housing 12 can be formed from a variety of techniques. It may be formed from multiple pieces of material (e.g., metal) that are fused or welded together, thereby forming a single unitary part. Alternatively, housing 12 may be an integral housing component formed from a single piece of material. The latter can create a seamless appearance (i.e., the walls and interfaces between the walls may be formed from one continuous piece rather than segmented or disconnected portions that are fused or bonded together). In some embodiments, a single slab of material may be machined out to create an enclosure with a cavity for placing the internal components of the device. However, this technique can be quite costly. Therefore, in other embodiments, a single sheet of material may be formed into an enclosure with a cavity for holding the internal components of the device.

Figure 2:
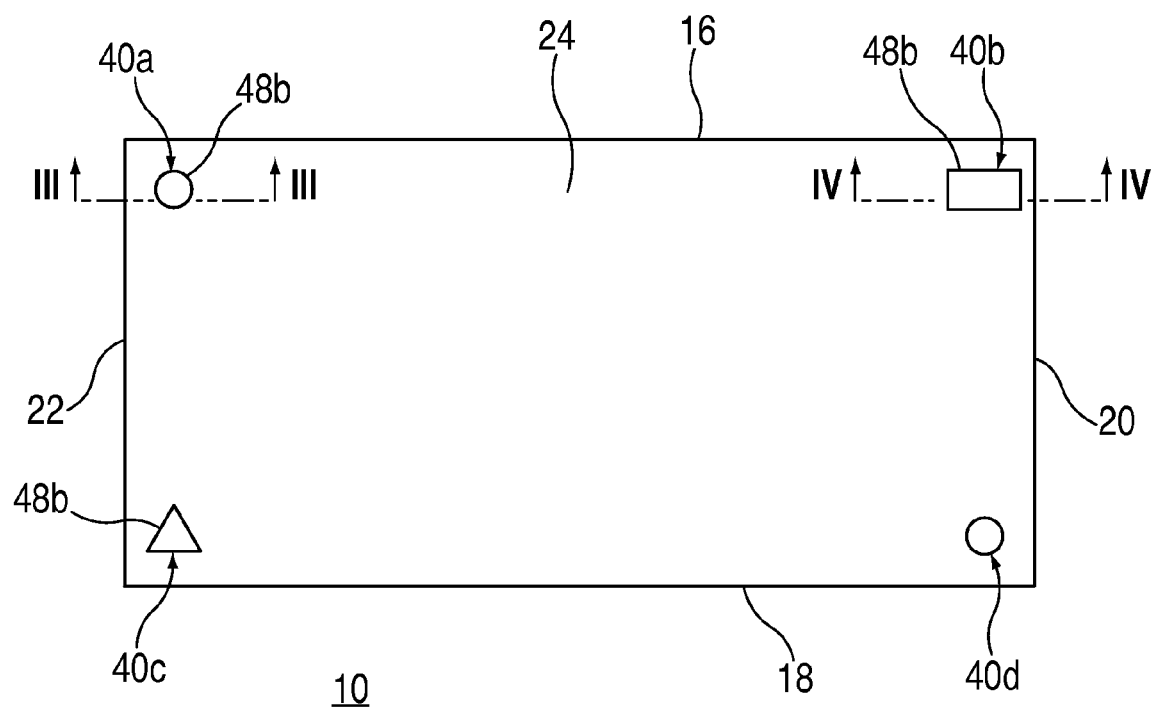
FIG. 2 is a bottom view of the electronic device of FIG. 1, taken from line II-II of FIG. 1.

Electronic device 10 may also include one or more foot assemblies 40 to raise electronic device 10 off of a supporting surface, such as supporting surface 1, which may be any surface suitable for at least partially withstanding the weight of electronic device 10. For example, as shown in FIGS. 1 and 2, electronic device 10 may include four foot assemblies 40 (i.e., foot assemblies 40a, 40b, 40c, and 40d) disposed on bottom wall 24 of housing 12. FIG. 2 shows a bottom view of electronic device 10 of FIG. 1. In some embodiments, as shown in FIG. 2, each one of foot assemblies 40a-40d may be generally positioned at or near a respective corner of bottom wall 24. However, each one of the one or more foot assemblies 40 of device 10 may be positioned at any respective portion of any wall of housing 12. For example, some foot assemblies may be positioned along a first wall of the housing and other foot assemblies may be positioned along a second wall of the housing.

As described above, a disadvantage of some conventional foot assemblies is that they include too many distinct parts. Another disadvantage of some conventional foot assemblies is that they require a housing with a significantly increased overall thickness at the respective portions coupled to the foot assemblies. Therefore, according to some embodiments of the invention, electronic device 10 can include at least one foot assembly 40 that includes only a few, if not only one or two, distinct parts. Also, according to some embodiments of the invention, electronic device 10 can include at least one foot assembly 40 that minimizes the overall thickness of the housing component portion at which it is disposed.

Figure 3:
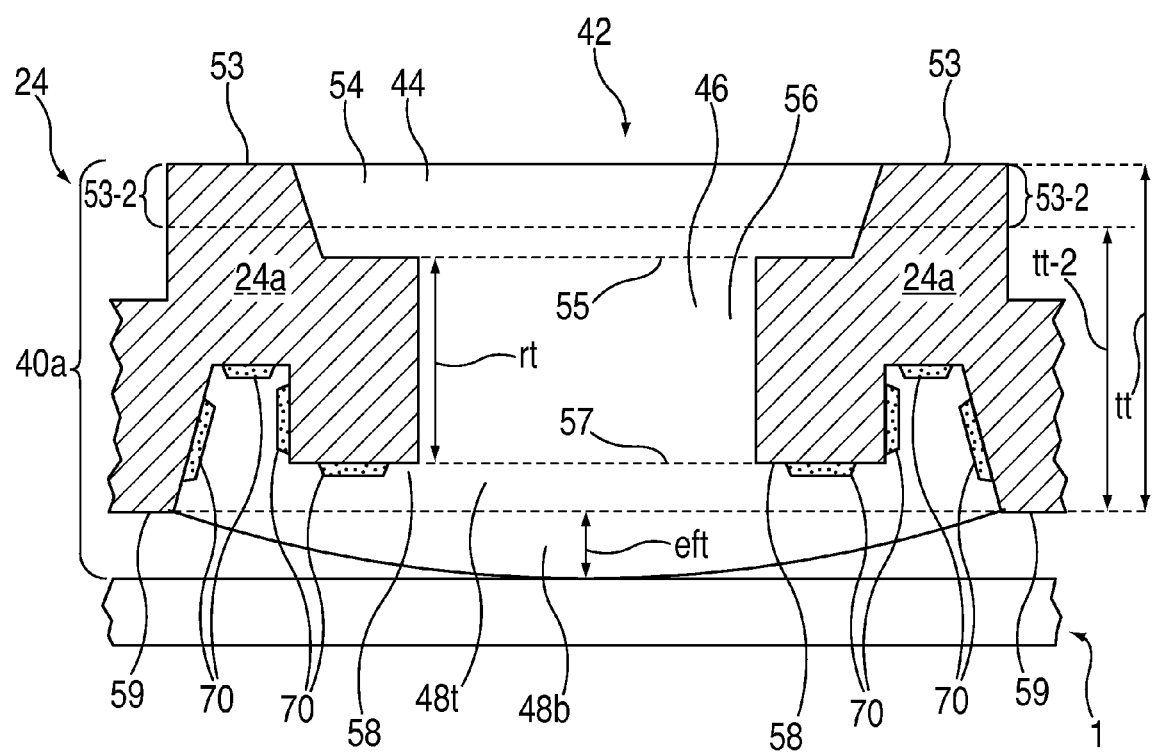
FIG. 3 is a partial cross-sectional view of a portion of the electronic device of FIGS. 1 and 2, taken from line III-III of FIG. 2.

For example, as shown in FIGS. 1-3, foot assembly 40a may include a foot 42 that may include an internal foot portion 44, an external foot portion 48, and a middle foot portion 46 extending between internal foot portion 44 and external foot portion 48. Foot assembly 40a may also include an internal cavity 54 in an internal surface 53 of bottom wall 24, an external cavity 58 in an external surface 59 of bottom wall 24, and a middle passageway 56 extending between internal cavity 54 and external cavity 58. Internal foot portion 44 may be at least partially contained within internal cavity 54, external foot portion 48 may be at least partially contained within external cavity 58, and middle foot portion 46 may be at least partially contained within middle passageway 56.

Figure 3A:
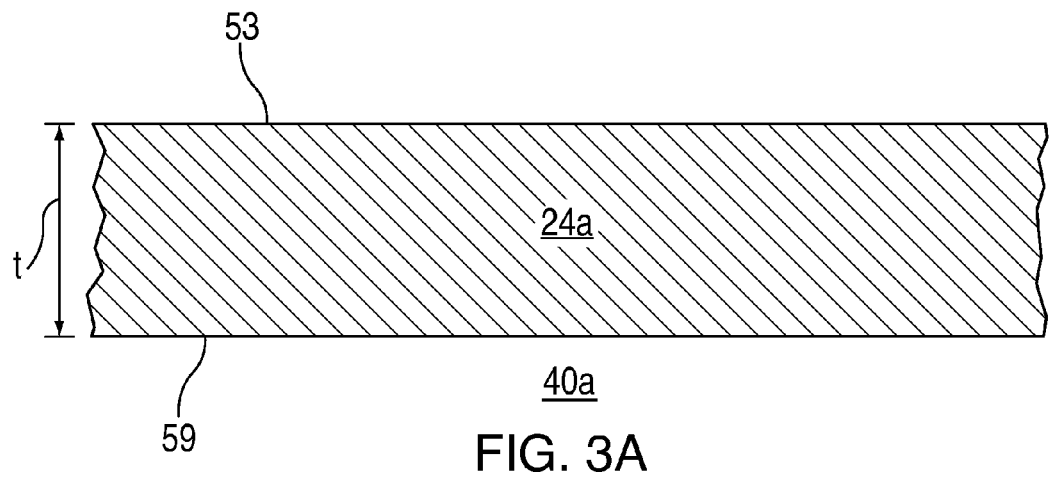
FIGS. 3A-3F are partial cross-sectional views of the portion of the electronic device of FIG. 3, in various stages of manufacture, in accordance with some embodiments of the invention.

FIGS. 3A-3F illustrate foot assembly 40a of housing 12 of electronic device 10 in various stages of manufacture, in accordance with some embodiments of the invention. FIG. 3A is a cross-sectional view showing a portion 24a of bottom wall 24 of housing 12. In some embodiments, bottom wall 24, or at least portion 24a of bottom wall 24, may be formed from a single piece of solid material. The single piece of material may, for example, be a piece of flat stock (e.g., sheet metal or aluminum). As shown in FIG. 3A, for example, wall portion 24a may have a thickness t between internal surface 53 and external surface 59 of wall 24. In some embodiments, thickness t may be in the range of 0.5 millimeters to 1.1 millimeters. In some embodiments, thickness t may be in the range of 0.6 millimeters to 1.0 millimeter. In some embodiments, thickness t may be in the range of 0.7 millimeters to 0.9 millimeters. In some embodiments, thickness t may be about 0.8 millimeters. Of course, thickness t of portion 24a can be widely varied and is not limited to these examples. For example, thickness t can be greater than 1.1 millimeters.

Figure 3B:
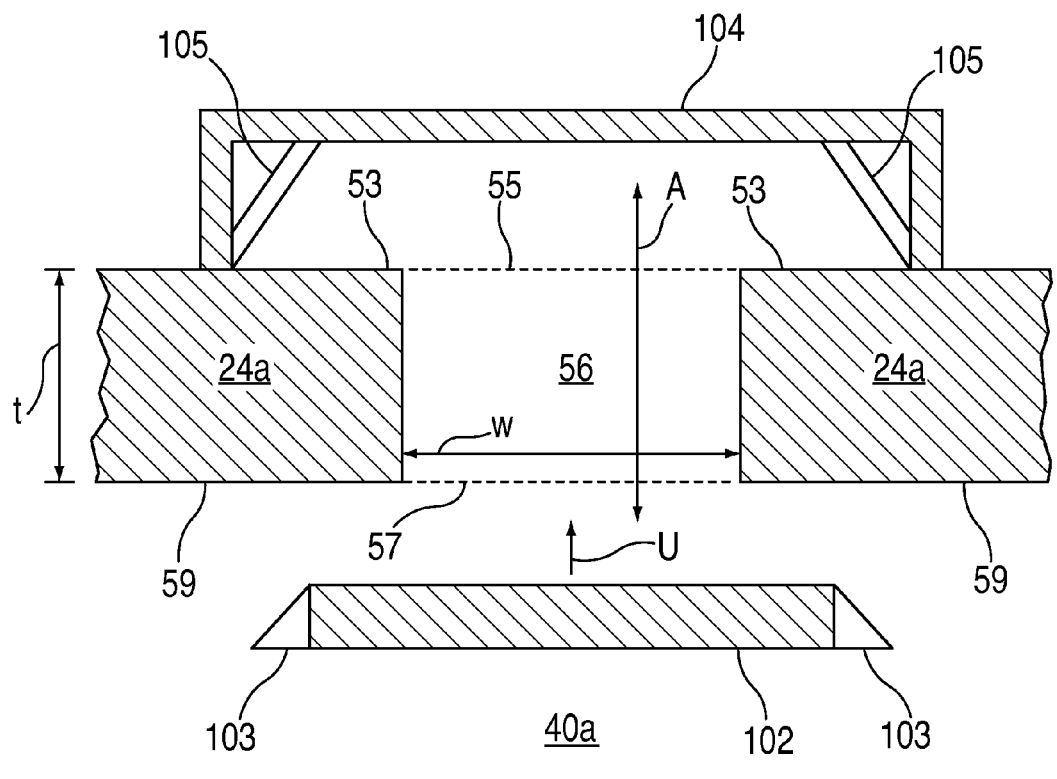

A hole may be formed by creating a hollow passageway through wall portion 24a between an internal opening in internal surface 53 and an external opening in external surface 59 of wall 24, thereby creating a hole or middle passageway 56 through wall 24, as shown in FIG. 3B. In some embodiments, middle passageway 56 may be formed such that substantially all sides of the passageway are parallel with an axis that is substantially perpendicular to external surface 59 of wall portion 24a. For example, as shown in FIG. 3B, the walls of middle passageway 56 through wall portion 24a that extend between an internal passageway opening 55 in internal surface 53 and an external passageway opening 57 in external surface 59 may be substantially parallel with an axis A that is substantially perpendicular to external surface 59 of wall portion 24a. Middle passageway 56 can have a cross-sectional width w.

Figure 3C:
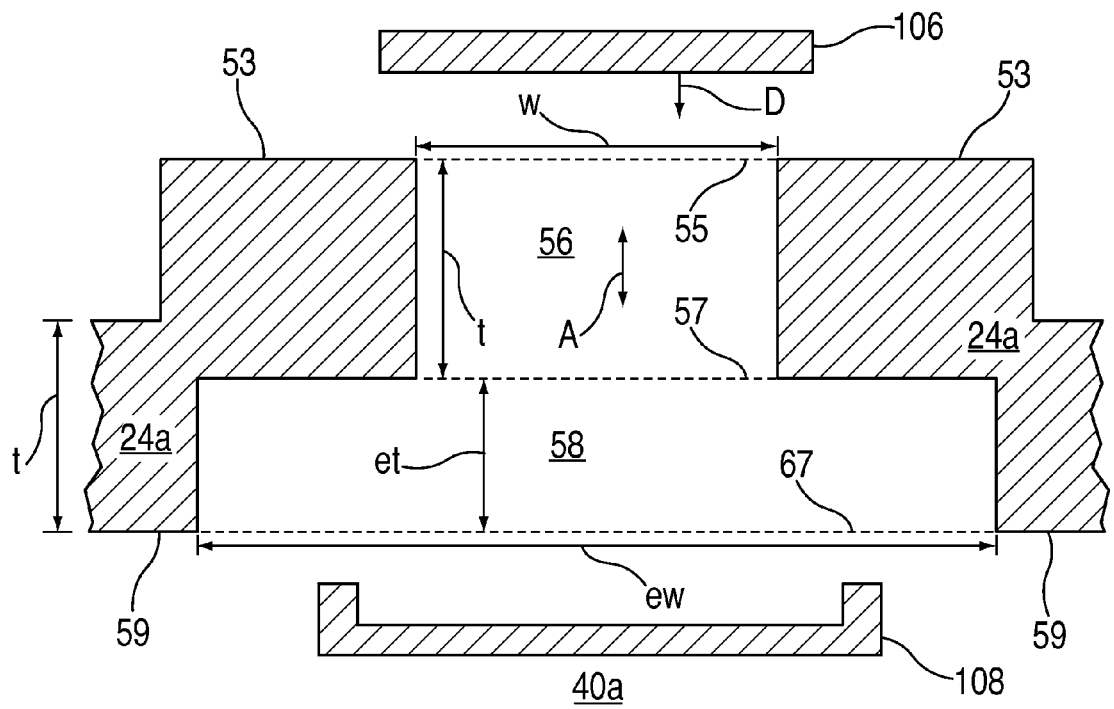

As shown in FIG. 3C, wall portion 24a may be half-sheared or dislodged to form an external cavity 58 in external surface 59 of wall portion 24a at least partially aligned with middle passageway 56. In some embodiments, as shown in FIG. 3B, a first draw portion 102 may be drawn in the direction of arrow U (e.g., parallel to axis A) toward a second draw portion 104, thereby shaping wall portion 24a into the shape of FIG. 3C including external cavity 58.

As shown in FIG. 3C, for example, external cavity 58 may have an external thickness et between an external cavity opening 67 in external surface 59 of wall portion 24a and external passageway opening 57 of middle passageway 56. In some embodiments, external thickness et may be in the range of 0.25 millimeters to 0.63 millimeters. In some embodiments, external thickness et may be in the range of 0.31 millimeters to 0.56 millimeters. In some embodiments, external thickness et may be in the range of 0.38 millimeters to 0.5 millimeters. In some embodiments, external thickness et may be about 0.44 millimeters. Of course, external thickness et of external cavity 58 can be widely varied and is only limited by thickness t of wall portion 24a. External thickness et of external cavity 58 may be smaller than, larger than, or equal to thickness t of wall portion 24a.

Moreover, as shown in FIG. 3C, external cavity 58 can have an external cross-sectional width ew spanning external cavity opening 67 in external surface 59 of wall portion 24a. External width ew of external cavity 58 may be smaller than, larger than, or equal to width w of middle passageway 56. While external cavity opening 67 of external cavity 58 is shown in FIG. 3C to be substantially centered with respect to external passageway opening 57 of middle passageway 56, external cavity 58 may be positioned in any other suitable way such that external cavity 58 at least partially overlaps with external passageway opening 57 of middle passageway 56. In some embodiments, external cavity 58 may be formed by a half-shearing or dislodging process followed by a punching process.

Figure 3D:
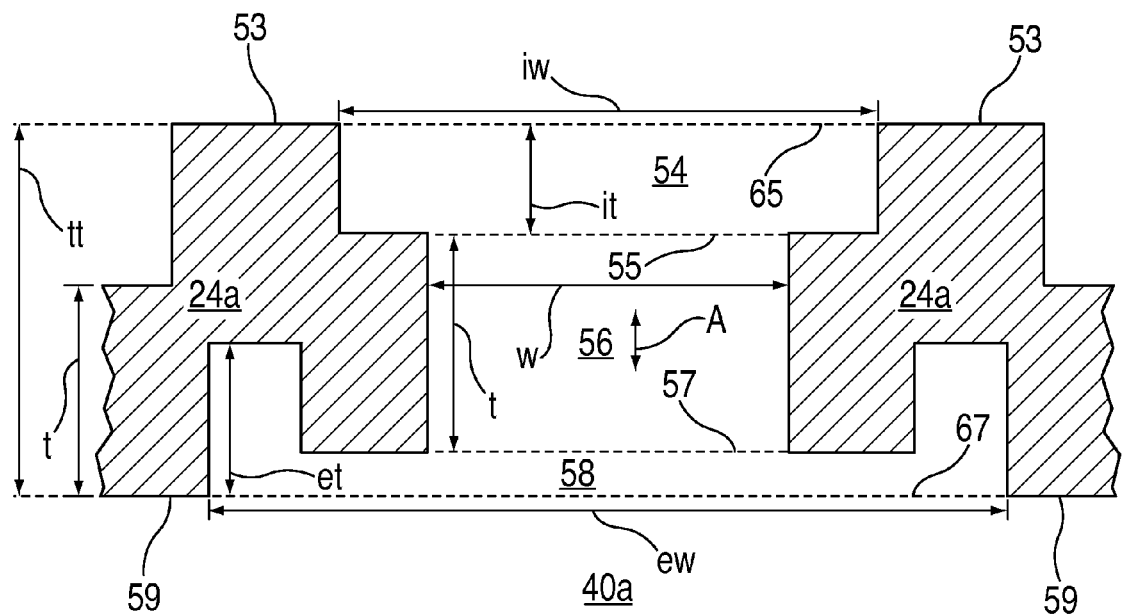

As shown in FIG. 3D, wall portion 24a may also be half-sheared or dislodged to form an internal cavity 54 in internal surface 53 of wall portion 24a at least partially aligned with middle opening 56. In some embodiments, as shown in FIG. 3C, a third draw portion 106 may be drawn in the direction of arrow D (e.g., parallel to axis A) toward a fourth draw portion 108, thereby shaping wall portion 24a into the shape of FIG. 3D including internal cavity 54.

As shown in FIG. 3D, for example, internal cavity 54 may have an internal thickness it between an internal cavity opening 65 in internal surface 53 of wall portion 24a and internal passageway opening 55 of middle passageway 56. In some embodiments, internal thickness it may be in the range of 0.20 millimeters to 0.50 millimeters. In some embodiments, internal thickness it may be in the range of 0.25 millimeters to 0.45 millimeters. In some embodiments, internal thickness it may be in the range of 0.30 millimeters to 0.40 millimeters. In some embodiments, internal thickness it may be about 0.35 millimeters. Of course, internal thickness it of internal cavity 54 can be widely varied and is only limited by thickness t of wall portion 24a. Internal thickness it of internal cavity 54 may be smaller than, larger than, or equal to external thickness et of external cavity 58. Internal thickness it of internal cavity 54 may be smaller than, larger than, or equal to thickness t of wall portion 24a as well.

Moreover, as shown in FIG. 3D, internal cavity 54 can have an internal cross-sectional width iw spanning internal cavity opening 65 in internal surface 53 of wall portion 24a. Internal width iw of internal cavity 54 may be smaller than, larger than, or equal to external width ew of external cavity 58. Internal width iw of internal cavity 54 may be larger than width w of middle passageway 56 as well. While internal cavity opening 65 of internal cavity 54 is shown in FIG. 3D to be substantially centered with respect to internal passageway opening 55 of middle passageway 56, internal cavity 54 may be positioned in any other suitable way such that internal cavity 54 at least partially overlaps with internal passageway opening 55 of middle passageway 56.

Figure 3E:
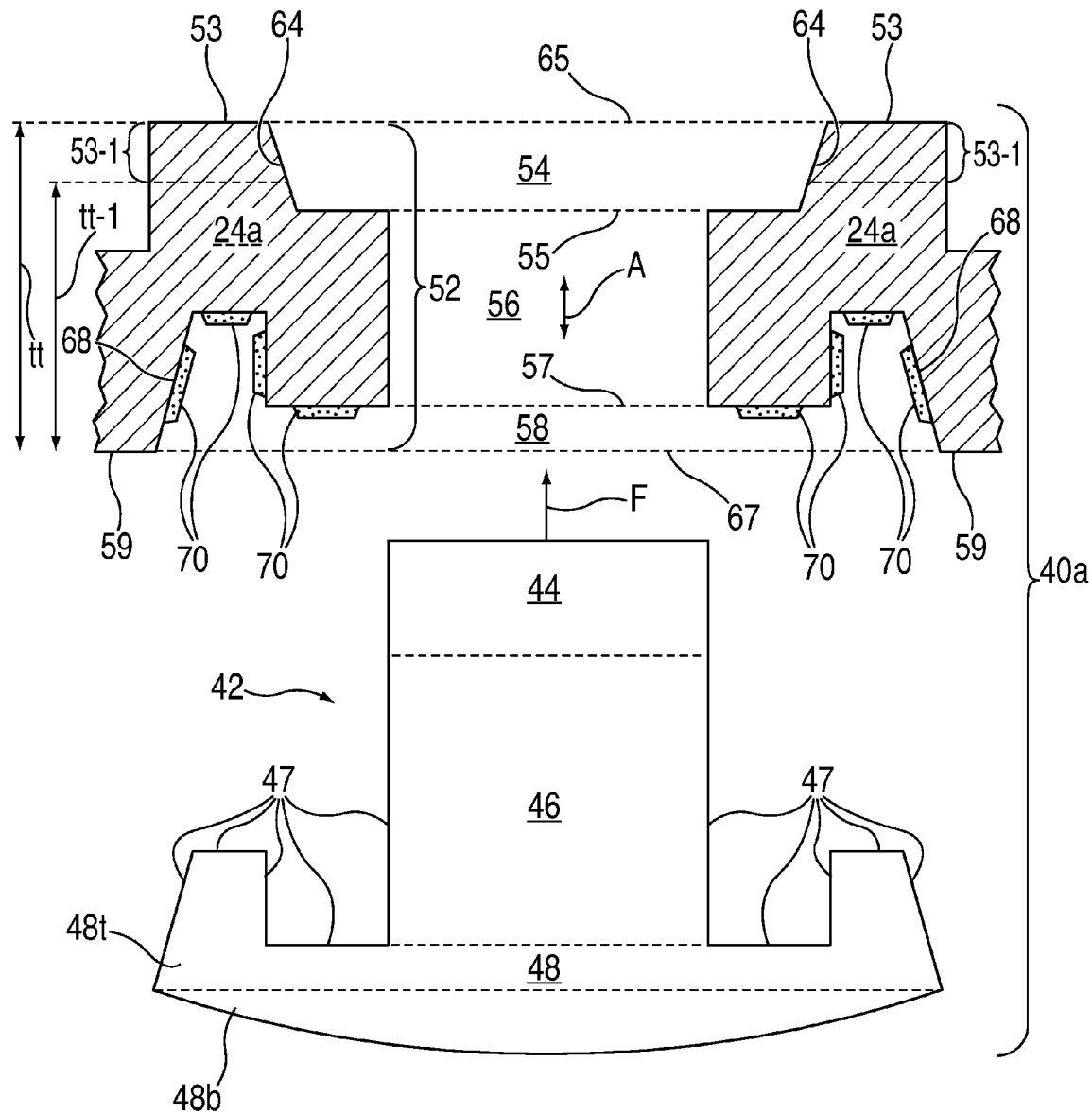

As shown in FIG. 3D, for example, wall portion 24a may have an overall total thickness tt between internal surface 53 and external surface 59 at foot assembly 40a about internal cavity 54, middle passageway 56, and external cavity 58, which together may be referred to as foot recess 52 (see, e.g., FIG. 3E). In some embodiments, overall total thickness tt may be in the range of 0.64 millimeters to 1.60 millimeter. In some embodiments, total thickness tt may be in the range of 0.80 millimeters to 1.44 millimeters. In some embodiments, total thickness tt may be in the range of 0.96 millimeters to 1.28 millimeters. In some embodiments, total thickness tt may be about 1.12 millimeters. Of course, total thickness tt of portion 24a can be widely varied and is not limited to these examples. For example, total thickness tt can be greater than 1.60 millimeters.

As shown in FIG. 3E, wall portion 24a may also be coined or otherwise contoured (e.g., through a drawing, machining, cold working, or cold forming procedure) to further alter the shape of foot recess 52 of foot assembly 40a. While the shearing or dislodging manufacturing steps described with respect to FIGS. 3B-3D may provide cavities with straight and crisp edges, in some embodiments, as shown in FIG. 3E, the portions of wall portion 24a about external cavity opening 67 may be contoured to form angled sides 68 extending between external surface 59 and a top portion of external cavity 58, as shown in FIG. 3E, for example. Sides 68 of external cavity 58 may be angled (e.g., with respect to axis A) through coining to vary the contours of external cavity 58, and, in some embodiments, external width ew of external cavity opening 67, for example. Any surface defining any portion of the shape of external cavity 58 may be coined to further contour external cavity 58 according to an embodiment of the invention. However, in other embodiments, external cavity 58 may be half-sheared or dislodged to form a cavity with the contours of FIG. 3E. For example, first draw portion 102 and second draw portion 104 of FIG. 2 may be provided with respective contoured portions 103 and 105 (see, e.g., FIG. 2) in order to provide a contoured shape to external cavity 58.

Moreover, any surface defining any portion of the shape of internal cavity 54 may be coined or otherwise contoured to further contour internal cavity 54 according to some embodiments of the invention (see, e.g., FIG. 3E and angled sides 64 of internal cavity 54). Likewise, any surface defining any portion of the shape of middle passageway 56 may be coined or otherwise contoured to further contour middle passageway 56 according to some embodiments of the invention.

In accordance with some embodiments, foot assembly 40a may also include adhesive material provided along one or more portions of one or more surfaces defining any portion of the shape of foot recess 52. For example, as shown in FIG. 3E, an adhesive 70 may be provided along one or more portions of any surface defining any portion of the shape of external cavity 58. Adhesive 70 may be any suitable adhesive type, such as a double-stick adhesive or pressure sensitive adhesive ("PSA").

Figure 3F:
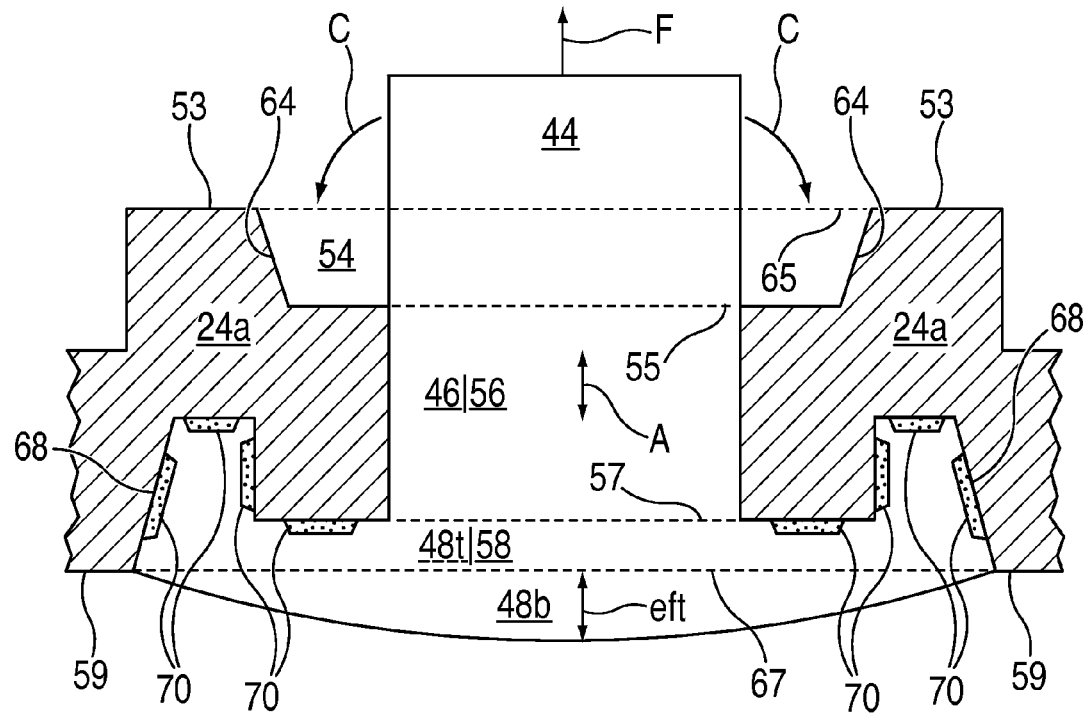

Once foot recess 52 has been formed, with or without any adhesives 70, a foot 42 may be fitted within foot recess 52 to complete foot assembly 40a. Foot 42 may include an internal foot portion 44, an external foot portion 48, and a middle foot portion 46 extending between internal foot portion 44 and external foot portion 48. Foot 42 may be forced upwardly in the direction of arrow F at least partially through foot recess 52, such that internal foot portion 44 may be at least partially contained within internal cavity 54, such that external foot portion 48 may be at least partially contained within external cavity 58, and such that middle foot portion 46 may be at least partially contained within middle passageway 56, as shown in FIG. 3F.

External foot portion 48 may be made of any suitable material that is rigid enough to raise and support external surface 59 of wall portion 24a above supporting surface 1 of FIGS. 1 and 3, such as a rigid plastic, thermoplastic elastomers ("TPE"), thermoplastic polyurethane ("TPU"), metal, and the like. External foot portion 48 may include a top portion 48t and a bottom portion 48b. In some embodiments, top portion 48t of external foot portion 48 may be substantially the same size and shape as external cavity 58 of foot recess 52, such that they may mate when foot 42 is forced upwardly in the direction of arrow F. When external cavity 58 is provided with one or more adhesive portions 70, at least a portion of the upper surface 47 of top portion 48t may contact and, therefore, stick to an adhesive 70. This may help retain foot 42 within foot recess 52, as shown in FIG. 3F.

Bottom portion 48b may extend downwardly from top portion 48t of external foot portion 48, and may define the portion of foot assembly 40a that extends outwardly from external surface 59 of wall portion 24a and contacts a support surface (e.g., surface 1 of FIG. 3). Bottom portion 48b of external foot portion 48 may have a maximum total thickness eft (e.g., 1.25 millimeters), which may define the spacing between external surface 59 of wall portion 24a and support surface 1. Bottom portion 48b may be any suitable size or shape. For example, as shown in FIG. 2, bottom foot portion 48b of foot assembly 40a may be have a circular cross-section, while bottom foot portion 48b of foot assembly 40b may be have a rectangular cross-section, and while bottom foot portion 48b of foot assembly 40c may be have a triangular cross-section. Similarly, the other portions of foot 42, as well as passageway 56 and cavities 54 and 58 of wall portion 24a, may each have a cross-section of any suitable size or shape.

Internal foot portion 44 may be made of any suitable material that is deformable to at least partially conform to the geometry of internal cavity 54 of foot recess 52 once it has passed through middle passageway 56, such as an elastomer or metal. For example, once foot 42 has been forced upwardly in the direction of arrow F, such that external foot portion 48 may be at least partially contained within external cavity 58, such that middle foot portion 46 may be at least partially contained within middle passageway 56, and such that internal foot portion 44 may be at least partially contained within internal cavity 54, as shown in FIG. 3F, at least a portion of internal foot portion 44 may be deformed in the direction of arrows C of FIG. 3F to conform to at least a portion of internal cavity 54, as shown in FIG. 3, thereby completing the formation of foot assembly 40a.

In some embodiments, at least a portion of internal foot portion 44 may be heated such that it conforms to and contacts at least a portion of a surface of wall portion 24a that at least partially defines the shape of internal cavity 54. Once a portion of internal foot portion 44 contacts a portion of a surface of wall portion 24a defining internal cavity 54, a thickness of wall portion 24a may be retained between a portion of internal foot portion 44 and a portion of external foot portion 48 (see, e.g., thickness rt of wall portion 24a of FIG. 3). In some embodiments, foot 42 may be a double injection mold, wherein a first shot may be of a rigid material, such as a thermoplastic polymer (e.g., a polycarbonate), and wherein a second shot may be of a softer material, such as a thermoplastic elastomer, at least at bottom portion 48b of external foot portion 48.

In some alternative embodiments, some of wall portion 24a may be removed from the foot assembly. For example, as shown in FIG. 3E, a wall subportion 53-1 including at least a portion of internal surface 53 of wall portion 24a may be removed before foot 42 is inserted into foot recess 52, thereby reducing the total thickness of the assembly from tt to tt-1. Alternatively, as shown in FIG. 3, an assembly subportion 53-2 including at least a portion of internal surface 53 of wall portion 24a and a portion of internal foot portion 44 may be removed after foot 42 has been inserted into foot recess 52, thereby reducing the total thickness of the assembly from tt to tt-2. This removal of a portion of the foot assembly may be accomplished using a machining process, for example.

In some alternative embodiments (not shown), the external foot portion may be deformable and the internal foot portion may be rigid. In such embodiments, the foot may be forced downwardly (e.g., in a direction opposite to the direction of arrow F of FIG. 3E) at least partially through foot recess 52, such that the internal foot portion may be at least partially contained within the internal cavity, such that the external foot portion may be at least partially contained within the external cavity, and such that the middle foot portion may be at least partially contained within the middle passageway, as shown in FIG. 3F. Then, at least a portion of the external foot portion may be heated or otherwise made malleable to conform to the external cavity. In such embodiments, the foot may be initially inserted into the foot recess from the internal side of the wall portion.

Figure 4:
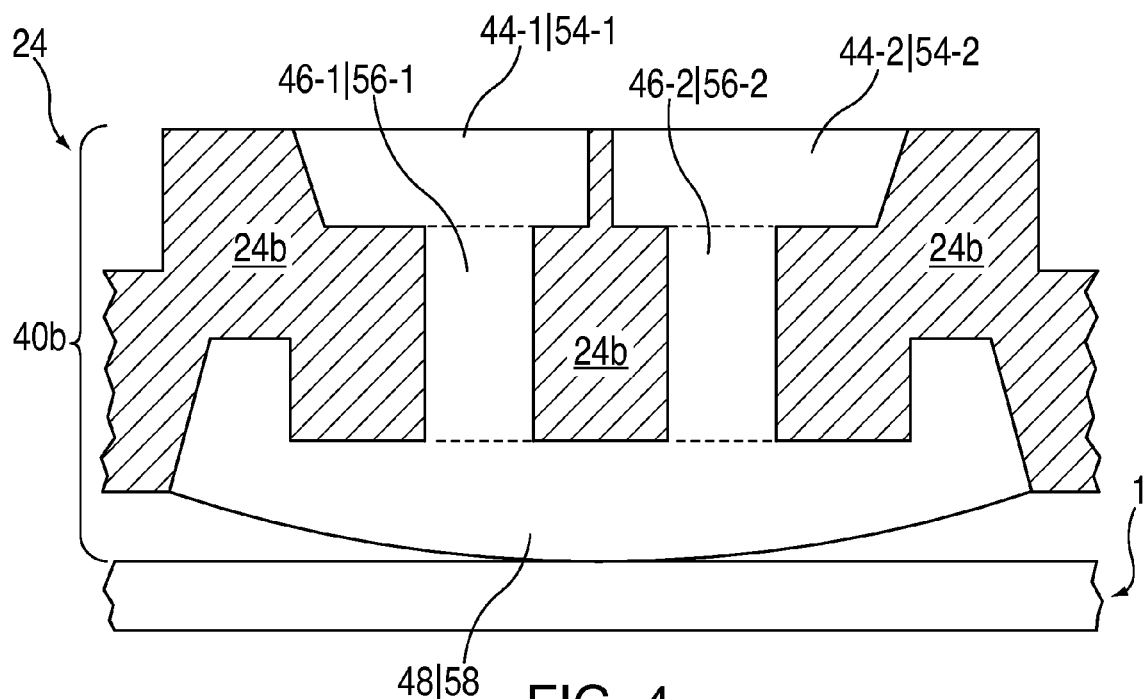
FIG. 4 is a partial cross-sectional view of a portion of the electronic device of FIGS. 1 and 2, taken from line IV-IV of FIG. 2.

In some embodiments, a foot assembly may include multiple internal cavities, external cavities, and/or passageways. For example, as shown in FIG. 4, foot assembly 40b may be substantially similar to foot assembly 40a of FIGS. 1-3F, except that it may include a wall portion 24b having multiple internal cavities 54 (e.g., internal cavities 54-1 and 54-2) and multiple passageways 56 (e.g., passageways 56-1 and 56-2) respectively cooperating with multiple internal foot portions 44 (e.g., internal foot portions 44-1 and 44-2) and multiple middle foot portions 46 (e.g., middle foot portions 46-1 and 46-2).

Figure 5:
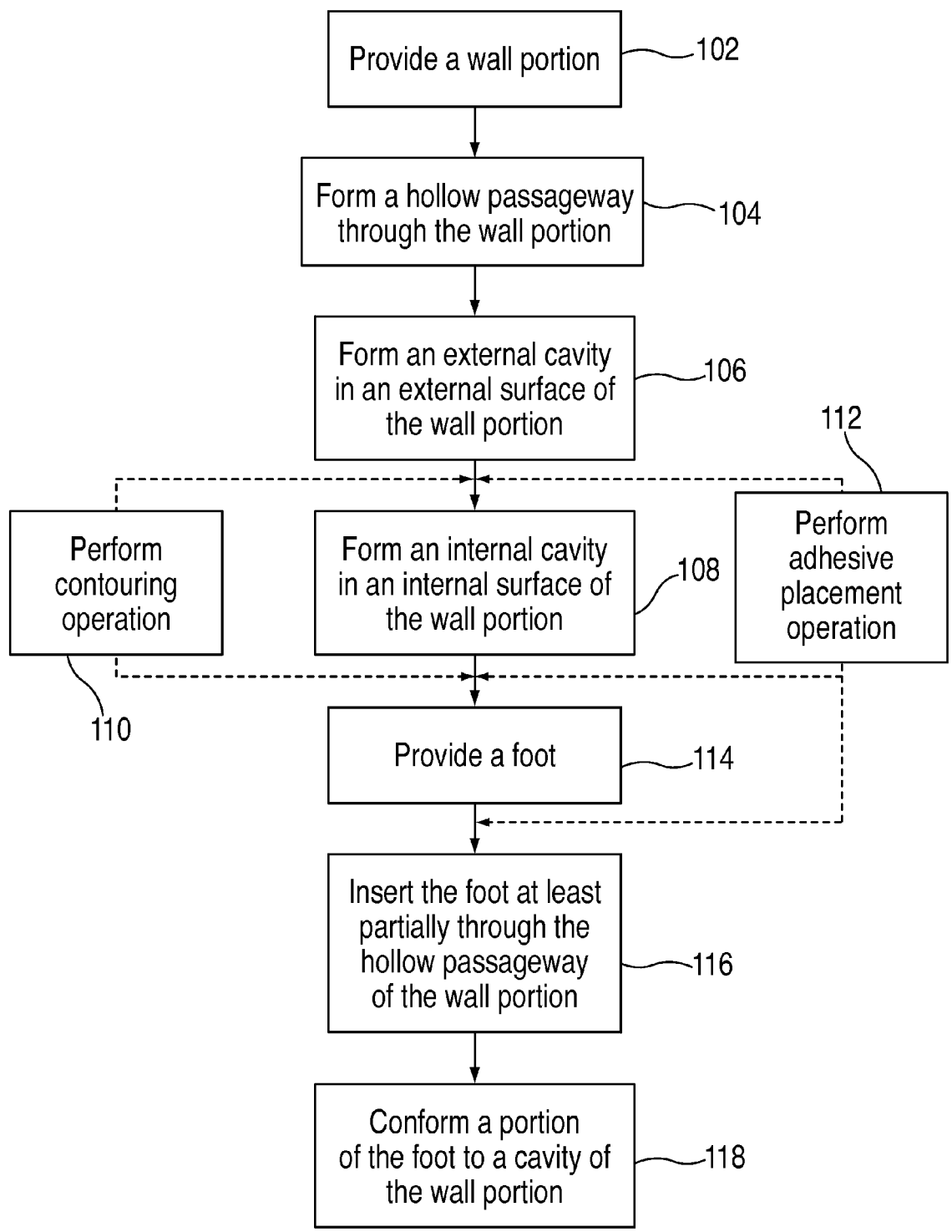
FIG. 5 is a flowchart of an illustrative process for manufacturing a foot assembly, in accordance with some embodiments of the invention.

FIG. 5 is a flowchart of an illustrative process 100 for manufacturing a foot assembly in accordance with some embodiments of the invention.

Process 100 may include step 102 where a piece of material (e.g., sheet metal or aluminum) may be provided as a wall portion of a component at which a foot assembly is to be formed (e.g., a bottom wall of an electronic device housing component). The material properties and thickness of the wall portion may typically be selected based on the processing steps to be applied. For example, it may have a thickness in the range of 0.5 millimeters to 1.1 millimeter, more particularly in the range of 0.6 millimeters to 1.0 millimeter, and even more particularly in the range of 0.7 millimeters to 0.9 millimeters. In some embodiments, the thickness of the wall portion may be about 0.8 millimeters. Of course, the thickness can be widely varied and is not limited to these examples. For example, the thickness can be greater than 1.1 millimeters in some embodiments. The material of the wall portion, such as metal flat stock, may additionally be formed from aluminum. The type of aluminum may typically be balanced with future foot assembly processing steps so as to allow proper metal forming without ripping and tearing, and without creating flow marks, as well as to provide needed rigidity and strength for the housing component. In essence, it may be soft enough to forge, but strong enough to support a foot assembly and, for example, to be an enclosure for an electronic device. In some embodiments, 5052 aluminum may be used.

Process 100 may also include step 104 where a hole forming process may be performed on the wall portion to create a hollow passageway through the wall portion. For example, a hollow passageway may be formed to extend between an opening in an external surface of the wall portion and an opening in an internal surface of the wall portion.

Process 100 may also include step 106 where an external cavity forming process may be performed on the wall portion to create an external cavity in the external surface of the wall portion. Any suitable process, such as drawing, shearing, dislodging, and combinations thereof, may be performed on the wall portion to create the external cavity. The external cavity may be formed to at least partially align with the passageway opening in the external surface of the wall portion. Various shapes may be formed by the external cavity. In some embodiments, the external cavity may have a substantially rectangular shape, although the external cavity may have any suitable shape (e.g., trapezoidal) to contain at least a portion of a foot element of the foot assembly.

Process 100 may also include step 108 where an internal cavity forming process may be performed on the wall portion to create an internal cavity in the internal surface of the wall portion. Any suitable process, such as drawing, shearing, dislodging, and combinations thereof, may be performed on the wall portion to create the internal cavity. The internal cavity may be formed to at least partially align with the passageway opening in the internal surface of the wall portion. Various shapes may be formed by the internal cavity. In some embodiments, the internal cavity may have a substantially rectangular shape, although the internal cavity may have any suitable shape to contain at least a portion of a foot element of the foot assembly.

In some embodiments, process 100 may also include step 110 where an optional contouring operation may be performed on one or more surfaces of the wall portion, such as on any surface defining any portion of any cavity formed in the wall portion. A contouring operation of step 110 may be performed on the external cavity before the formation of the internal cavity at step 106. Alternatively or additionally, a contouring operation of step 110 may be performed after the formation of both the external cavity and the internal cavity. A contouring operation may be configured to contour the surfaces of the cavity or cavities to better receive a foot element of the foot assembly. For example, a contouring operation may provide a cavity with more surface area. As another example, a contouring operation may increase the depth at which a cavity extends into the wall portion.

In some embodiments, process 100 may also include step 112 where an optional adhesive placement operation may be performed along one or more surfaces of the wall portion. An adhesive placement operation of step 112 may be performed after the formation of the external cavity and before the formation of the internal cavity. Alternatively or additionally, an adhesive placement operation of step 112 may be performed after the formation of both the external cavity and the internal cavity. For example, an adhesive placement operation may provide any suitable adhesive along one or more surfaces of the wall portion defining the external cavity to help the wall portion better receive and hold a foot element of the foot assembly.

Process 100 may also include step 114 where a foot element may be provided. The foot may include a middle foot portion extending between an external foot portion and an internal foot portion. In some embodiments, an adhesive placement operation of step 112 may be performed after a foot is provided at step 114. In such embodiments, an adhesive placement operation may provide any suitable adhesive along one or more surfaces of the foot to help the foot better retain its position with respect to the wall portion during later steps of process 100 for example. In some embodiments, one of the internal and external foot portions may be at least partially rigid and the other of the internal and external foot portions may be at least partially deformable.

Process 100 may also include step 116 where a portion of the foot may be inserted at least partially through the hollow passageway of the wall portion. For example, the internal foot portion may be inserted from the external side of the wall portion, through the external cavity and middle passageway, and at least partially into the internal cavity of the wall portion. In some embodiments, the internal foot portion may be inserted at least partially into the internal cavity, such that a portion of the middle foot portion may be contained within the middle passageway, such that a portion of the external foot portion may be contained within the external cavity and contacting a surface of the wall portion defining the external cavity (or contacting an adhesive that is also contacting a portion of the external cavity), and such that at least one other portion of the external foot portion may extend out of the external cavity and away from the external surface of the wall portion.

Process 100 may also include step 118 where a conforming process may be performed on a portion of the foot to at least partially conform the foot to the geometry of a cavity of the wall portion. For example, at least a portion of the internal foot portion may be deformed to contact at least a portion of a surface of the wall portion that at least partially defines the shape of the internal cavity of the wall portion. In some embodiments, a portion of the foot may be made of a deformable material (e.g., an elastomer), and may be heated such that it at least partially conforms to one or more surfaces defining the internal cavity of the wall portion. In other embodiments, for example, at step 116, the external foot portion may be inserted from the internal side of the wall portion, through the internal cavity and middle passageway, and at least partially into the external cavity of the wall portion, and at step 118, at least a portion of the external foot portion may be deformed to contact at least a portion of a surface of the wall portion that at least partially defines the shape of the external cavity of the wall portion.

Additional steps may then be performed. For example, a portion the wall portion that at least partially defines the shape of the internal cavity of the wall portion, for example, including the internal surface of the wall portion, may be removed to reduce the thickness of the foot assembly. This may be done before step 116. Alternatively, this removal process may be done after step 116 and/or step 118 such that the removal step may remove not only some of the wall portion, but also some of the internal foot portion.

It is understood that the steps shown in FIG. 4 are merely illustrative and that existing steps may be modified, added, or omitted. For example, persons skilled in the art will appreciate that step 104 of forming a hollow passageway may be performed before or after step 106 of forming an external cavity and/or before or after step 108 of forming an internal cavity. In some embodiments where the internal and external cavities are formed before the hollow passageway, the hollow passageway may be formed to extend between a portion of the internal cavity and a portion of the external cavity.

While there have been described apparatus and methods for the construction of foot assemblies, it is to be understood that many changes may be made therein without departing from the spirit and scope of the invention. For example, although foot assemblies have been described as being constructed with portions of a bottom wall of an electronic device housing component, it is to be understood that the foot assemblies of the invention may be constructed with any type of wall portion of any type of component. It is also to be understood that various directional and orientational terms such as "front" and "back" and "rear," "left" and "right," "top" and "bottom," "side" and "edge" and "corner," "thickness" and "width," and the like are used herein only for convenience, and that no fixed or absolute directional or orientational limitations are intended by the use of these words. For example, the wall portions of this invention can have any desired orientation. If reoriented, different directional or orientational terms may need to be used in their description, but that will not alter their fundamental nature as within the scope and spirit of this invention. Those skilled in the art will appreciate that the invention can be practiced by other than the described embodiments, which are presented for purposes of illustration rather than of limitation, and the invention is limited only by the claims which follow.

What is claimed is:

1. A method of forming a foot assembly, the method comprising:
   providing a wall having an internal wall surface and an external wall surface;
   forming a hollow passageway through the wall between the internal wall surface and the external wall surface;
   forming an external cavity in the external wall surface;
   forming an internal cavity in the internal wall surface;
   providing a foot having a middle foot portion extending between an internal foot portion and an external foot portion;
   inserting the internal foot portion through the external cavity, through the hollow passageway, and into the internal cavity; and
   conforming at least a portion of the internal foot portion to the internal cavity.

2. The method of claim 1, wherein the forming the external cavity comprises half-shearing the wall.

3. The method of claim 2, wherein the forming the external cavity further comprises machining the wall.

4. The method of claim 1, wherein the forming the internal cavity comprises half-shearing the wall.

5. The method of claim 4, wherein the forming the external cavity further comprises machining the wall.

6. The method of claim 1, wherein the conforming comprises heating the at least a portion of the internal foot portion.

7. The method of claim 1, wherein the internal foot portion is a thermoplastic polymer.

8. The method of claim 1, wherein at least a portion of the external foot portion is a thermoplastic elastomer.

9. The method of claim 1 further comprising placing an adhesive on a wall surface of the external cavity before the inserting.

10. The method of claim 1 further comprising placing an adhesive on a portion of the external foot portion before the inserting.

11. The method of claim 1, wherein a portion of the wall is retained between a portion of the external foot portion and the conformed portion of the internal foot portion.

12. A foot assembly comprising:
    a wall having an internal cavity in an internal wall surface, an external cavity in an external wall surface, and a hollow passageway extending through the wall between the internal cavity and the external cavity; and
    a foot having a middle foot portion extending between an internal foot portion positioned at least partially within the internal cavity and an external foot portion positioned at least partially within the external cavity, wherein at least a portion of the internal foot portion is configured to conform to the internal cavity.

13. The foot assembly of claim 12, wherein the internal foot portion is a thermoplastic polymer.

14. The foot assembly of claim 12, wherein at least a portion of the external foot portion is a thermoplastic elastomer.

15. The foot assembly of claim 12 further comprising an adhesive between a wall surface of the external cavity and a portion of the external foot portion.

16. The foot assembly of claim 12, wherein a portion of the wall is retained between a portion of the external foot portion and a conformed portion of the internal foot portion.

17. The foot assembly of claim 12, wherein:
    the wall further comprises a second internal cavity in the internal wall surface, and a second hollow passageway extending through the wall between the second internal cavity and the external cavity; and
    the foot further comprises a second middle foot portion extending between a second internal foot portion positioned at least partially within the second internal cavity and the external foot portion.

18. The foot assembly of claim 17, wherein at least a portion of the second internal foot portion is configured to conform to the second internal cavity.

19. An electronic device comprising:
    an internal electronic component; and
    a housing at least partially enclosing the internal electronic component, wherein the housing comprises the foot assembly of claim 1.

20. The electronic device of claim 19, wherein the electronic device is a laptop computer.

* * * * *